(12) United States Patent
Morvan

(10) Patent No.: US 10,050,112 B2
(45) Date of Patent: *Aug. 14, 2018

(54) ELECTRON GAS CONFINEMENT HETEROJUNCTION TRANSISTOR

(71) Applicant: Commissariat A L'Energie Atomique et aux Energies Alternatives, Paris (FR)

(72) Inventor: Erwan Morvan, Montagne (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

This patent is subject to a terminal disclaimer.

(21) Appl. No.: 15/423,968

(22) Filed: Feb. 3, 2017

(65) Prior Publication Data
US 2017/0229550 A1    Aug. 10, 2017

(30) Foreign Application Priority Data
Feb. 4, 2016 (FR) ...................... 16 50899

(51) Int. Cl.
| H01L 29/778 | (2006.01) |
| H01L 29/20 | (2006.01) |
| H01L 29/06 | (2006.01) |
| H01L 29/207 | (2006.01) |
| H01L 29/205 | (2006.01) |

(52) U.S. Cl.
CPC ........ *H01L 29/207* (2013.01); *H01L 29/0607* (2013.01); *H01L 29/2003* (2013.01); *H01L 29/205* (2013.01); *H01L 29/7786* (2013.01)

(58) Field of Classification Search
CPC ......... H01L 29/66431; H01L 29/66462; H01L 29/778; H01L 29/7783; H01L 29/7786; H01L 29/7787; H01L 29/785
USPC .......................................... 257/76
See application file for complete search history.

(56) References Cited

U.S. PATENT DOCUMENTS

| 2011/0272708 A1 | 11/2011 | Yoshioka et al. |
| 2013/0240899 A1 | 9/2013 | Yoshioka et al. |

(Continued)

OTHER PUBLICATIONS

French Preliminary Search Report dated Nov. 28, 2016 in French Application 16 50899, filed on Feb. 4, 2016 ( with English Translation of Categories of Documents & Written Opinion).

(Continued)

*Primary Examiner* — Caleen Sullivan
(74) *Attorney, Agent, or Firm* — Oblon, McClelland, Maier & Neustadt, L.L.P.

(57) ABSTRACT

A high electron mobility heterojunction transistor, including a first GaN layer; a second, p-doped GaN layer on top of the first layer, including magnesium as a p-type dopant, the concentration of which is at least equal to $5*10^{16}$ cm$^{-3}$ and at most equal to $2*10^{18}$ cm$^{-3}$, the thickness of the second GaN layer being between 20 and 50 nm; a third, n-doped GaN layer on top of the second GaN layer in order to form a depleted p-n junction; a fourth GaN layer, which is not intentionally doped, on top of the third GaN layer; a semiconductor layer plumb with the fourth GaN layer, which is not intentionally doped, in order to form an electron gas layer.

10 Claims, 2 Drawing Sheets

(56) References Cited

U.S. PATENT DOCUMENTS

2015/0076508 A1* 3/2015 Saito .................. H01L 29/4236
257/76
2017/0148908 A1* 5/2017 Yumoto .............. H01L 29/7806

OTHER PUBLICATIONS

Maojun Wang et al. "Normally-Off Hybrid $Al_2O_3$/GaN MOSFET on Silicon Substrate Based on Wet-Etching", Proceedings of the 26th International Symposium on Power Semiconductor Devices & IC's, 2014, 4 pages.

Dong-Seok Kim et al "Normally-Off AlGaN/GaN Metal-Oxide-Semiconductor Heterostructure Field-Effect Transistor with Recessed Gate and p-GaN Back-Barrier", Japanese Journal of Applied Physics 51, 2012, 6 pages.

Ma Juncai et al. "Characteristics of AlGaN/GaN/AlGaN double heterojunction HEMTs with an improved breakdown voltage", Journal of Semiconductors, vol. 33, No. 1, 2012, 5 pages.

Dong-Seok Kim et al. "High Performance in a Normally-off Al2O3/GaN MOSFET Based on an AlGaN/GaN Heterostructure with a p-GaN Buffer Layer", Journal of the Korean Physical Society, vol. 58, No. 5, 2011, 5 pages.

Maojun Wang et al. "900 V/1.6 mΩ . $cm^2$ Normally off $Al_2O_3$/GaN MOSFET on Silicon Substrate", IEEE Transactions on Electron Devices, vol. 61,No. 6, 2014, 6 pages.

* cited by examiner

ELECTRON GAS CONFINEMENT HETEROJUNCTION TRANSISTOR

The invention relates to high electron mobility transistors based on the presence of heterojunctions and, in particular, to heterojunction transistors employing GaN semiconductor layers.

Higher performance is now required from many electronic applications, especially in embedded electronics intended for cars and ground-based means of transportation, in aeronautics and medical systems or in home automation solutions, for example. These applications for the most part require high-power switches functioning in frequency ranges often above one megahertz.

Historically, power switches have for a long time used field-effect transistors based on a semiconductor channel, most often made of silicon. At lower frequencies, junction transistors are preferred because they are able to withstand higher current densities. However, because of the relatively limited breakdown voltage of each of these transistors, power applications require many transistors connected in series, or longer transistors, to be used, thereby resulting in a higher on-resistance. These series transistors generate substantial losses, both in the steady-state and switching regimes.

An alternative for power switches, especially high-frequency power switches, is the use of high electron mobility field-effect transistors, also referred to as heterostructure field-effect transistors. Such transistors include a superposition of two semiconductor layers having different band gaps, forming a quantum well at their interface. Electrons are confined to this quantum well and form a two-dimensional electron gas. For reasons of high-voltage and temperature withstand, these transistors are chosen to have a wide energy band gap.

Among wide energy band gap HEMT transistors, transistors based on gallium nitride are very promising. The width of their energy band gap results in a higher critical electrical field compared to conventional electronic materials, in a high carrier saturation velocity, and in good thermal and chemical stability. The breakdown field of gallium nitride may thus be higher than $2\times10^6$ V/cm, thereby easily allowing compact transistors with breakdown voltages higher than 600 V to be produced. In addition, such transistors allow very high current densities to be obtained by virtue of the very high electron mobility and high electron density of the interface electron gas.

The document "Characteristics of AlGaN/GaN/AlGaN double heterojunction HEMTs with an improved breakdown voltage", published in the January 2012, Volume 33, Number 1 issue of Journal of Semiconductors, describes a first HEMT transistor structure. This structure comprises an SiC substrate surmounted by a 100 nm AlN nucleation layer, surmounted by a 1.5 µm GaN buffer layer, surmounted by a 1 nm AlN intermediate layer, surmounted by a 22 nm AlGaN barrier layer, surmounted by a 1 nm GaN layer on which the source, the gate and the drain of the transistor are formed. An electron gas layer is formed at the interface between the GaN buffer layer and the AlGaN barrier layer, the AlN intermediate layer being considered to belong to this interface.

In practice, the GaN buffer layer presents a relatively low potential barrier, such that electrons of the electron gas layer may easily escape from the potential well to be trapped in the GaN buffer layer, for example when the transistor is off. The conduction performance of the transistor is then greatly diminished due to the decrease in the electron density.

The inclusion of carbon or magnesium in the buffer layer, in a non-negligible proportion, has been proposed in order to limit the escape from the potential well by raising the conduction band. However, the electrons that actually escape from the potential well are then trapped in the buffer layer where a high concentration of deep levels is present.

The document "Characteristics of AlGaN/GaN/AlGaN double heterojunction HEMTs with an improved breakdown voltage" describes a second HEMT transistor structure intended to form an electrical barrier between the electron gas layer and the buffer layer, in order to prevent the electrons being injected into this buffer layer. This structure comprises an SiC substrate surmounted by a 100 nm AlN nucleation layer, surmounted by a 1.5 µm $Al_{0.07}Ga_{0.93}N$ buffer layer, surmounted by a 10 nm GaN channel layer, surmounted by a 1 nm AlN intermediate layer, surmounted by a 22 nm AlGaN barrier layer, surmounted by a 1 nm GaN layer on which the source, the gate and the drain of the transistor are formed. An electron gas layer is formed at the interface between the GaN channel layer and the AlGaN barrier layer, the AlN intermediate layer being considered to belong to this interface. This structure is referred to as a double heterojunction HEMT. The buffer layer allows the energy of the conduction band to be raised and confines the electrons to the channel layer.

However, such a structure still presents an insufficient electrical barrier. Furthermore, the presence of the AlGaN barrier layer leads to additional mechanical stresses in the structure of the transistor.

The document US2011/272708 describes a high electron mobility heterojunction transistor, in particular comprising:
 a first GaN layer;
 a second, p-doped GaN layer formed on top of the first GaN layer;
 a third, n-doped GaN layer formed on top of the second GaN layer so as to form a depleted p-n junction.

This document does not allow the p-doped GaN layer to be completely depleted, and does not allow good voltage withstand and a sufficient electrical barrier to be obtained.

The document "Normally-Off $Al_2O_3$/GaN MOSFET on Silicon Substrate based on Wet-Etching", published by Mrs Wang et al. as part of the $26^{th}$ International Symposium on Power Semiconductor Devices & ICs which was held from the 15 to the 19 Jun. 2014 in Hawaii, describes a MOSFET transistor produced on a silicon substrate. Normally-off operation is obtained by gate recess using an oxidation- and wet etching-based AlGaN barrier remove technique.

The invention aims to overcome one or more of these drawbacks. The invention thus pertains to a high electron mobility heterojunction transistor, as defined in Claim 1.

The invention also pertains to the variants of the appended claims. Those skilled in the art will understand that each of the features of the variants of the dependent claims may be combined independently with the features above, without constituting an intermediate generalization.

Other features and advantages of the invention will become clearly apparent from the description that is given thereof below by way of completely non-limiting indication and with reference to the appended drawings, in which.

Figure 1:
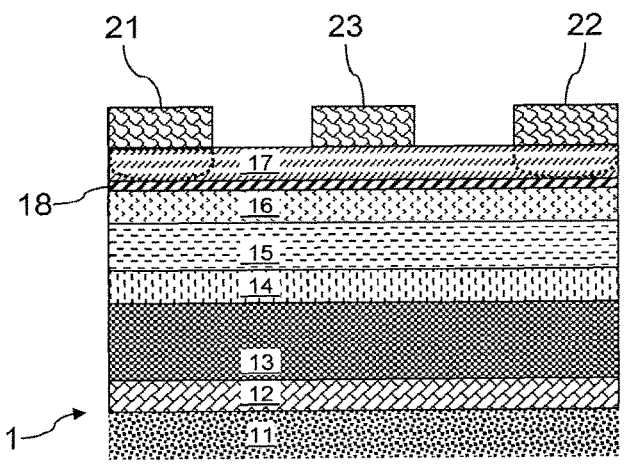
FIG. 1 is a cross-sectional view of an exemplary high electron mobility heterojunction transistor according to the invention.

FIG. 1 is a schematic cross-sectional view of an exemplary high electron mobility heterojunction transistor according to one embodiment of the invention. The transistor 1 comprises a substrate 11, an intermediate layer 12 positioned on the substrate 11, a GaN buffer layer 13 positioned on the intermediate layer 12, a p-doped GaN layer 14 positioned on the GaN buffer layer 13, an n-doped GaN layer 15 positioned on the GaN layer 14 and a GaN layer 16, which is not intentionally doped, positioned on the layer 15. The transistor 1 additionally comprises an AlGaN layer 17 positioned on the layer 16. An electron gas is intrinsically formed by heterojunction at the interface between the layer 17 and the layer 16. For the sake of legibility, the electron gas is illustrated in the form of layer 18 at the interface between the layer 16 and the layer 17. An intermediate layer (not illustrated) may be interposed between the layers 16 and 17, for example in order to increase the electron density and mobility in the electron gas. Such an intermediate layer is typically extremely thin (for example 1 nm) and may be made of AlN (particularly suited to the interface between a GaN layer 16 and an AlGaN layer 17).

In a manner known per se, the transistor 1 comprises a source 21, a drain 22 and a control gate 23 which are formed on the AlGaN layer 17. The source 21, the drain 22 and the control gate 23 are only schematically illustrated, their dimensions and their structures potentially differing substantially from the illustration of FIG. 1.

The substrate 11 may be an insulator, an intrinsic or doped silicon semiconductor, SiC or sapphire. The thickness of the substrate 11 may typically be of the order of 650 μm to 1 mm.

The intermediate layer 12 (which may be formed from a superposition of transition layers) is deposited on the substrate 11. The transition layer 12 allows the crystal lattice parameters between the GaN layers 11 and 13 to be adjusted. This makes it possible to manage the mechanical stresses between the substrate 11 and an active portion of layers formed by epitaxy. The layer 12 may include the superposition of a nucleation layer (typically of AlN with a thickness of about 100 nm) and multiple adaptation layers (for example multiple layers of AlGaN with a decreasing molar fraction of AlN, or else a superlattice comprising multiple AlxGa(1-x)N/GaN) bilayers.

Such an intermediate layer 12 has been shown to be particularly advantageous in the case of a substantial mismatch of lattice parameters between the layer 13 and the substrate 11, which could result in mechanical dislocations within these layers.

The thickness of the buffer layer 13 may be dependent on the target voltage for the transistor 1, for example it may have a thickness of a few microns. A relatively substantial thickness of the buffer layer 13 makes it possible to limit the lateral and vertical leakage currents in the transistor 1 and also to better confine the electron gas layer 18. The buffer layer 13 may, for example, be made of carbon-doped (semi-insulator) GaN—Si or of the superposition of a layer of GaN—Si/AlxGa(1-x)N, where x is small, for example between 4 and 8%.

The thickness of the p-doped GaN layer 14 is, for example, 50 nm and its acceptor concentration $N_A$ is, for example, $1*10^{17}$ cm$^{-3}$. The thickness of the n-doped GaN layer 15 is, for example, 80 nm and its donor concentration $N_D$ is, for example, $2*10^{16}$ cm$^{-3}$. The carbon concentration of the layers 14 and 15 is lower than that of the layer 13. This carbon concentration is, for example, lower than $1*10^{16}$ cm$^{-3}$.

The thickness of the GaN layer 16, which is not intentionally doped, is, for example, 50 nm. In order to favour maximum electron mobility in the electron gas layer 18, the doping of the GaN layer 16 is as low as possible. A layer 16 will, for example, be considered to be not intentionally doped if the concentration of n and p dopants is lower than $1*10^{16}$ cm$^{-3}$. The thickness of the AlGaN layer 17 is, for example, 25 nm.

Advantageously, the p-doped layer 14 is doped with magnesium, which chemical element may easily be integrated into the layer 14 during a potential formation by means of epitaxy. Additionally, magnesium may easily be activated. Advantageously, the n-doped layer 15 is doped with silicon, which chemical element may easily be integrated into the layer 15 during a potential formation by means of epitaxy.

The superposition of the p-doped GaN layer 14 on the n-doped GaN layer 15 allows a depleted p-n junction to be formed, so as to form a particularly high potential barrier below the electron gas layer. The p-n junction formed may be completely depleted, with appropriate thicknesses and dopant concentrations in the layers 14 and 15. Additionally, such a junction is formed using materials compatible with the GaN layer 16, which is not intentionally doped, intended to form the electron gas layer. Additionally, such a potential barrier allows the formation of an AlGaN layer below this GaN layer 16, which is not intentionally doped, to be avoided, thereby making it possible to limit the mechanical stresses at the interface with this GaN layer 16.

This technical solution of the invention may be applied both to a normally-off transistor and to a normally-on transistor.

Figure 2:
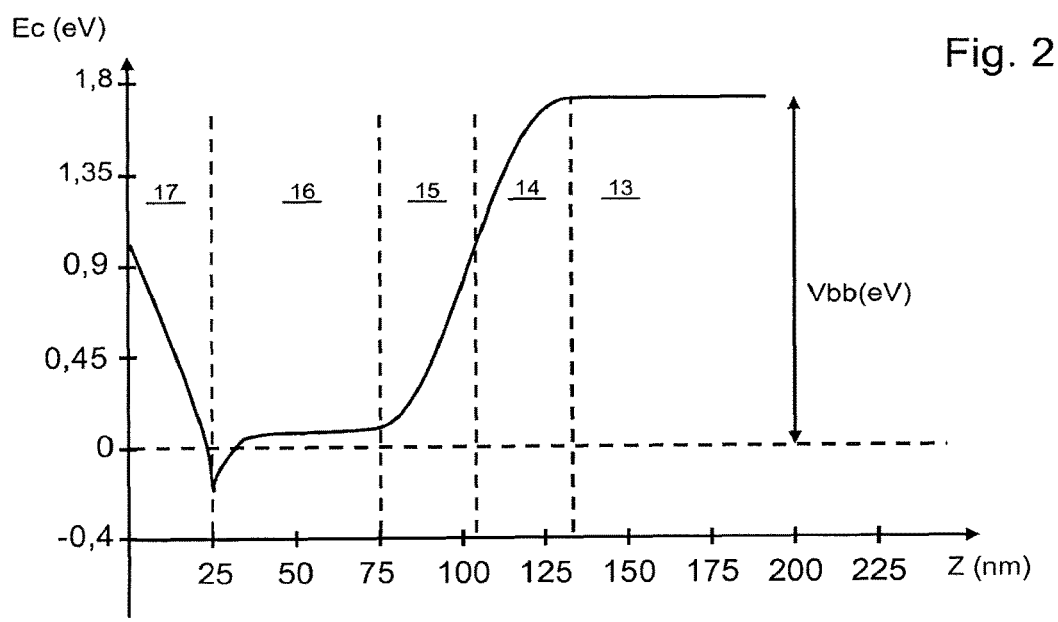
FIGS. 2 and 3 are diagrams of conduction bands of a transistor according to the invention and of a transistor according to the prior art.
Figure 3:
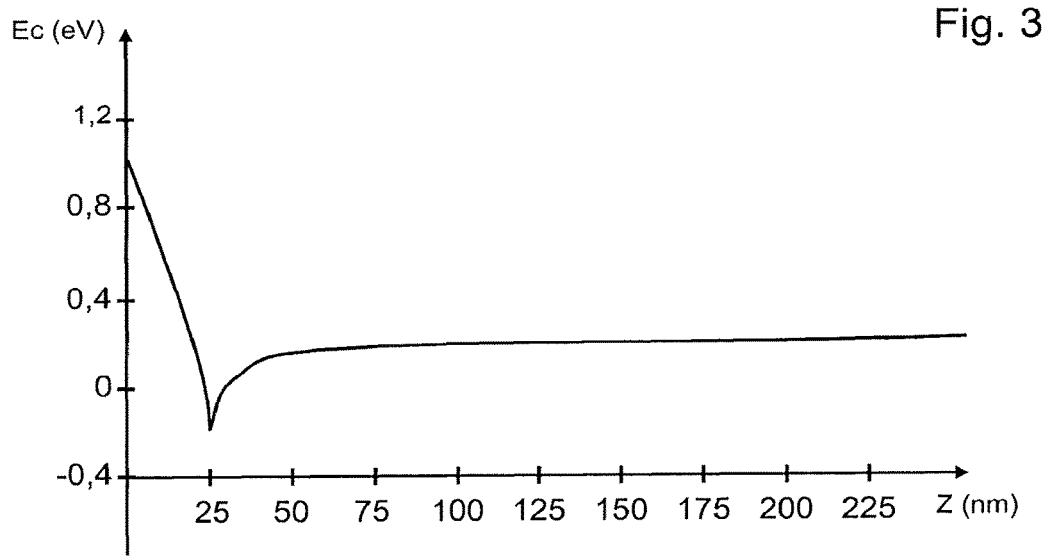

FIG. 2 is a conduction band diagram of the transistor 1 described above as a function of depth. By way of comparison, FIG. 3 provides a conduction band diagram of a transistor of the prior art as a function of depth. The transistor of the prior art under consideration comprises a 25 nm AlGaN layer formed on top of a GaN layer, which is not intentionally doped, and the thickness of which is 1.40 μm.

It has been observed that the potential barrier for the transistor 1 according to the invention is about 1.3 eV. In contrast, the potential barrier of the transistor according to the prior art is about 0.15 eV. The transistor 1 according to the invention thus makes it possible to obtain a particularly high potential barrier in order to avoid electrons of the electron gas layer 18 being trapped in the layer 13 for example. Simulations have made it possible to determine that the electron densities in the respective electron gas layers of these transistors are substantially equivalent, i.e. about $8.5*10^{12}$ cm$^{-2}$ for the transistor of the example of FIG. 3, compared to about $8.2*10^{12}$ cm$^{-2}$ for the transistor of the example of FIG. 2. The electron density of the electron gas layer 18 according to the invention therefore remains particularly high.

The influence of various parameters of the layers 14, 15 and 16 on the formation of a potential barrier for the electron gas layer 18 and the GaN layer 16 will be described in more detail below.

Figure 4:
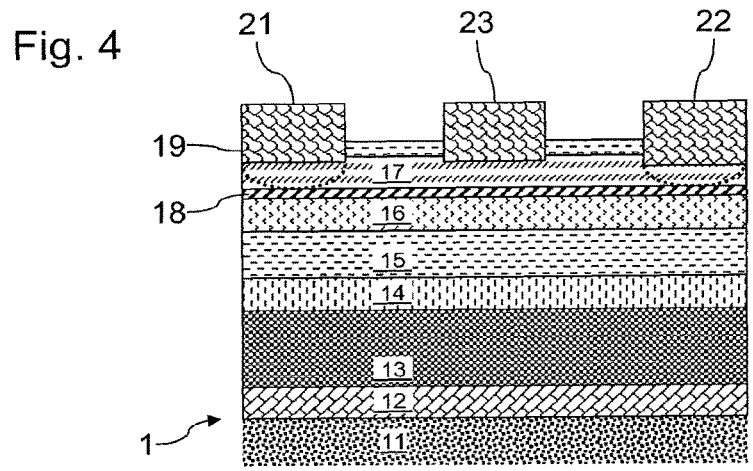
FIG. 4 is a cross-sectional view of another exemplary variant of a high electron mobility heterojunction transistor according to the invention.

According to one variant illustrated in FIG. 4, a GaN layer 19 is formed in a manner known per se on top of the AlGaN layer 17, in order to avoid oxidation of the AlGaN layer 17. The layer 19 is etched below the contacts in order to make contact with the layer 17. The thickness of the layer 19 is, for example, between 1 and 3 nm.

In order to make it possible to predict the influence of various parameters on the performance of the transistor 1 according to the invention, the following notation will be used hereinafter:

Ns: the electron density in the electron gas layer (in $cm^{-2}$);

$\mu_{2\ DEG}$: the electron mobility in the electron gas layer (en $cm^2/Vs$);

$N_D$: the volumetric density of donors in the n-doped GaN layer 15 (in $cm^{-3}$);

$N_A$: the volumetric density of acceptors in the p-doped GaN layer 14 (in $cm^{-3}$);

$N_{A-}$: the volumetric density of acceptors in a p-doped GaN layer that is sufficiently thick not to be depleted (en $cm^{-3}$);

$N_{D+}$: the volumetric density of donors in an n-doped GaN layer that is sufficiently thick not to be depleted (en $cm^{-3}$);

ni: the intrinsic carrier density in a GaN layer at room temperature (in $cm^{-3}$);

RT: room temperature, taken to be 300 K;

T: the temperature of the substrate in K;

Nsc: the electron density in the layer 16 of the transistor 1 (in $cm^{-2}$);

Wn: the thickness of the n-doped GaN layer 15;

Wnid: the thickness of the GaN layer 16, which is not intentionally doped;

Wp: the thickness of the p-doped GaN layer 14;

Vbi: the built-in potential of the p-n junction formed at the interface between the layers 14 and 15;

Vbbpn: the potential barrier across the terminals of the depleted p-n junction;

Vbbnid: the potential barrier across the terminals of the GaN layer 16, which is not intentionally doped;

Vbb: the total potential barrier;

$\varepsilon_0$: the permittivity of vacuum;

$\varepsilon_{sc}$: the permittivity of GaN;

k: the Boltzmann constant=1.3806488 $E^{-23}$ J/K;

q: the charge of an electron≈1.6 $E^{-19}$ C.

The accesses of the transistor 1 include the zones between the control gate 23 and the drain 22, and between the control gate 23 and the source 21, including the electron gas layer 18.

The built-in potential of the junction between the layers 14 and 15 may be defined as follows:

$$V_{bi(T)} = \frac{k \cdot T}{q} \ln\left(\frac{N_{A(T)}^- \cdot N_{D(T)}^+}{n_{i(T)}^2}\right)$$

With p-doping using magnesium, the ionization energy of the Mg acceptor in the GaN is about 180 meV. Ionization is therefore partial at temperature RT. This must therefore be taken into account for the calculation of Vbi by means of the inequality $N_{A-} < N_A$ at temperature RT.

When ni=$1.9e^{-10}$ $cm^{-3}$ at temperature RT, ND≈$N_{D+}$=$1e^{16}$ $cm^{-3}$ (with silicon doping) and $N_{A-}$=$1e^{17}$ $cm^{-3}$, Vbi≈3.1 V is obtained. Vbi remains largely insensitive to variations in $N_{A-}$ and $N_{D+}$ owing to the logarithm in the relationship and to the low value of ni.

The potential barrier formed between the electron gas layer 18 and the buffer layer 13 (preventing electrons being injected into and trapped in the deep layers of the buffer layer 13) appears by virtue of the built-in potential Vbi, and includes:

in part a potential barrier across the terminals of the p-n junction formed between the layers 14 and 15:

$$V_{bbnid} = \frac{q}{\varepsilon_s}(N_A \cdot W_p - N_D \cdot W_n) \cdot W_{nid}$$

in part a potential barrier across the terminals of the GaN layer 16:

$$V_{bbpn} = \frac{q}{2\varepsilon_s}(N_A \cdot W_p^2 + 2N_A \cdot W_p \cdot W_n - N_D \cdot W_n^2)$$

In the space charge zone of the p-n junction, all of the acceptors and donors are ionized and it is therefore their total concentration that appears in the calculations (Na-=Na and Nd+=Nd).

The potential barrier obtained by combining the layers 14 and 15 attains a higher level than that of a potential layer of AlGaN placed below the layer 16 forming the electron gas (as in the example described in "Characteristics of AlGaN/GaN/AlGaN double heterojunction HEMTs with an improved breakdown voltage" cited in the introduction).

The design rules of such a transistor 1 may be cited.

When the dopant of the layer 14 is magnesium, the end limits for $N_A$ are fixed by:

the capability of the epitaxy technology to incorporate magnesium into the GaN layer 14 and to activate it there (accounting for a solubility limit and passivation by complexes, in particular Mg—H complexes). The maximum usable value for $N_A$ is currently a priori $1e^{19}$ $cm^{-3}$;

the value required to have a Vbi>3V, namely $N_A$>$3e^{16}$ $cm^{-3}$.

A transistor 1 according to the invention within this range of values could theoretically be designed. In practice, a concentration of $1e^{17}$ $cm^{-3}$<$N_A$<$1e^{18}$ $cm^{-3}$ will advantageously be used. $N_A$>$1e^{17}$ $cm^{-3}$ allows a substantial back barrier (>1.3 V) to be obtained and $N_A$<$1e^{18}$ $cm^{-3}$ allows the p-layer 14 to be robust in terms of thickness (Wp>15 nm).

For the layer 15, an $N_D$ value between $1e^{17}$ $cm^{-3}$ and $N_A$ may be selected, for example, in particular with Si as the dopant.

The built-in potential Vbimay subsequently be calculated according to the relationship described above.

A corresponding total depletion thickness Wn0 in a GaN n-layer and a corresponding total depletion thickness Wp0 in a GaN p-layer may then be calculated, in the case that the thicknesses of the n- and p-layers are greater than Wn0 and Wp0, respectively.

It is then possible to determine the thicknesses of the GaN layers 15 and 14 to be produced so that they are completely depleted, observing only the following inequalities:

$Wn0 \geq Wn$; and $Wp0 \geq Wp$.

The layer 14 is advantageously completely depleted, in order to avoid the retention of a conductive layer of holes which would prevent the penetration of the electric field through the thickness of the GaN layer 13, thereby leading to a substantial decrease in the voltage withstand of the transistor.

$$W_p < W_{p0} = \sqrt{\frac{2\varepsilon_s \cdot V_{bi} \cdot N_D}{q \cdot N_A \cdot (N_A + N_D)}}$$

When Vbi=3.1 V, $N_A=1*10^{18}$ cm$^{-3}$ and $N_D=1*10^{18}$ cm$^{-3}$, a $W_{p0}$ value of 41 nm is obtained. A $W_p$ value that is sufficiently high to enable robust epitaxial production thereof is used (for example $W_p>10$ nm). A $W_p$ value of 28 nm may be chosen, for example. A decrease in the $W_p$ value lowers the level of the potential barrier. However, a decrease in the $W_p$ value guarantees the depletion of the GaN layer 14. Advantageously, $W_p$ is between 30 and 50 nm, and it is preferably equal to 50 nm.

In order to obtain complete depletion of the GaN layer 15, the following relationship is verified:

$$W_n < W_{n0} = \sqrt{\frac{2\varepsilon_s \cdot V_{bi} \cdot N_A}{q \cdot N_D \cdot (N_A + N_D)}}$$

When $N_A=N_D=1^e18$ cm$^{-3}$, $W_{no}=41$ nm, a $W_n$ value of 28 nm may be chosen, for example.

Advantageously, Wn≥0.2*Wn0 or Wn≥10 nm, in order to avoid the depletion having an effect on the electron gas layer 18. Specifically, the layer 15 must absorb a non-negligible proportion of the built-in potential. A sufficiently substantial thickness Wn is additionally used so that the potential barrier generated by the junction is sufficient to prevent the injection of electrons with a sufficient developed space charge into the layer 15. A Wn value of 28 nm is sufficient, for example.

Advantageously, Wn0 is greater than Wn (for example Wn0>Wn), such that the GaN layer 15 is completely depleted below the electrodes of the transistor 1. For example, for a Wn0 value of 41 nm, a Wn value of less than 41 nm may be chosen.

When Wn=28 nm, Wp=28 nm and $N_A=N_D=1e^{18}$ cm$^{-3}$, a potential barrier of about 1.7 eV is obtained, 0.9 eV of which is across the terminals of the junction and 0.3 eV of which is across the terminals of the layer 16.

The layer 16 is advantageously sufficiently thick to prevent any disruption of the electron gas layer 18 at the electrodes of the transistor through the influence of the dopants of the layers 14 and 15. Thus, advantageously, 100 nm≥Wnid≥50 nm (for example obtained when Wn=28 nm and Wn+Wnid≥78 nm in order to limit the effect of the magnesium on the electron gas layer 18). Advantageously, Wnid=50 nm.

The layers 12 to 18 may be formed successively in one and the same vapour phase epitaxy machine, while of course changing the epitaxy conditions for each of the layers. The epitaxy parameters for the formation of each of the layers are known per se to those skilled in the art.

In the example illustrated, the barrier layer 17 is formed from AlGaN. According to the invention, any other semiconductor layer may be positioned on top of the GaN layer 16, which is not intentionally doped, if it is capable of generating an electron gas at their interface. The layer 17 may, for example, be another ternary group-III nitride alloy. The layer 17 may also be a binary group-III nitride alloy, for example AlN.

In the example, the AlGaN of the layer 17 may comprise an aluminium concentration of between 6 and 9%, but other aluminium proportions may of course be used.

In the various variants, it is possible to envisage interposing an AlN layer between an AlGaN layer 17 and a GaN layer 16, in order to enhance the confinement of the electron gas and the mobility thereof. The thickness of this AlN layer is advantageously between 5 ångströms and 2 nm.

The layer 17 may advantageously be covered by a passivation layer, in particular in order to improve the insulation between the electrodes of the transistor 1. The passivation layer may, for example, be made of SiN. A layer of SiN may be deposited by means of epitaxy, without removing the wafer from the epitaxy installation after the formation of the layers 16 and 17.

The invention claimed is:

1. A high electron mobility heterojunction transistor, comprising:
    a first GaN layer;
    a second, p-doped GaN layer formed on top of the first GaN layer, this second GaN layer including magnesium forming a p-type dopant, the concentration of magnesium in the second GaN layer being at least equal to $5*10^{16}$ cm$^{-3}$ and at most equal to $2*10^{18}$ cm$^{-3}$, the thickness of said second GaN layer being between 20 and 50 nm;
    a third, n-doped GaN layer formed on top of the second GaN layer so as to form a depleted p-n junction;
    a fourth GaN layer, which is not intentionally doped, formed on top of the third GaN layer;
    a semiconductor layer formed plumb with the fourth GaN layer, which is not intentionally doped, in order to form an electron gas layer.

2. The heterojunction transistor according to claim 1, in which the third GaN layer includes silicon forming an n-type dopant.

3. The heterojunction transistor according to claim 2, in which the concentration of silicon in the third GaN layer is at least equal to $1.5*10^{16}$ cm$^{-3}$.

4. The heterojunction transistor according to claim 2, in which the concentration of silicon in the third GaN layer is at most equal to $2*10^{18}$ cm$^{-3}$.

5. The heterojunction transistor according to claim 1, in which the thickness of said third GaN layer is between 10 and 100 nm.

6. The heterojunction transistor according to claim 1, in which the dopant concentration of said fourth layer is less than $1*10^{16}$ cm$^{-3}$.

7. The heterojunction transistor according to claim 1, in which the thickness of said fourth layer is between 50 and 100 nm.

8. The heterojunction transistor according to claim 1, in which the carbon concentration of said first GaN layer is greater than that of the second and third GaN layers.

9. The heterojunction transistor according to claim 1, in which said semiconductor layer includes AlGaN.

10. A high electron mobility heterojunction transistor, comprising:
    a first GaN layer;
    a second, p-doped GaN layer formed on top of the first GaN layer, this second GaN layer including magnesium forming a p-type dopant, the concentration of magnesium in the second GaN layer being at least equal to $5*10^{16}$ cm$^{-3}$ and at most equal to $2*10^{18}$ cm$^{-3}$, the thickness of said second GaN layer being between 20 and 50 nm;
    a third, n-doped GaN layer formed on top of the second GaN layer so as to form a depleted p-n junction;
    a fourth GaN layer, which is not intentionally doped, formed on top of the third GaN layer;
    a semiconductor layer formed plumb with the fourth GaN layer, which is not intentionally doped, in order to form an electron gas layer,
    and further comprising another semiconductor layer, made of AlN, the thickness of which is between 0.5 and 2 nm, positioned between the fourth GaN layer and said semiconductor layer formed plumb with the fourth GaN layer.

\* \* \* \* \*